United States Patent
Nirschl et al.

(10) Patent No.: US 7,304,342 B2
(45) Date of Patent: Dec. 4, 2007

(54) SEMICONDUCTOR MEMORY CELL AND ASSOCIATED FABRICATION METHOD

(75) Inventors: Thomas Nirschl, Göttersdorf (DE); Alexander Olbrich, Höhenkirchenerstr (DE); Martin Ostermayr, Feldkirchen (DE)

(73) Assignee: Infineon Technologies AG, Munich (DE)

( * ) Notice: Subject to any disclaimer, the term of this patent is extended or adjusted under 35 U.S.C. 154(b) by 345 days.

(21) Appl. No.: 11/039,745

(22) Filed: Jan. 18, 2005

(65) Prior Publication Data

US 2005/0156218 A1    Jul. 21, 2005

(30) Foreign Application Priority Data

Jan. 21, 2004  (DE)  .................. 10 2004 003 084

(51) Int. Cl.
*H01L 27/108* (2006.01)
*H01L 29/76* (2006.01)
*H01L 29/94* (2006.01)
*H01L 31/119* (2006.01)

(52) U.S. Cl. .................................................. 257/301

(58) Field of Classification Search ............... 257/296, 257/310
See application file for complete search history.

(56) References Cited

U.S. PATENT DOCUMENTS

| | | | |
|---|---|---|---|
| 4,577,395 A | | 3/1986 | Shibata |
| 4,792,834 A | * | 12/1988 | Uchida ....................... 257/304 |
| 6,225,657 B1 | * | 5/2001 | Saeki .......................... 257/296 |
| 6,700,154 B1 | * | 3/2004 | Vidmantas et al. ......... 257/316 |

FOREIGN PATENT DOCUMENTS

EP    0 149 799    3/1988

* cited by examiner

*Primary Examiner*—Cuong Nguyen
(74) *Attorney, Agent, or Firm*—Brinks Hofer Gilson & Lione

(57) ABSTRACT

A semiconductor memory cell and an associated fabrication method are provided in which a storage capacitor is connected to a selection transistor. The storage capacitor is formed in a trench of a semiconductor substrate. At the trench surface, a capacitor dielectric and an electrically conductive filling layer are formed thereon for realization of a capacitor counterelectrode. The filling layer has a projection that extends outside the trench as far as the drain region and is electrically connected thereto.

11 Claims, 5 Drawing Sheets

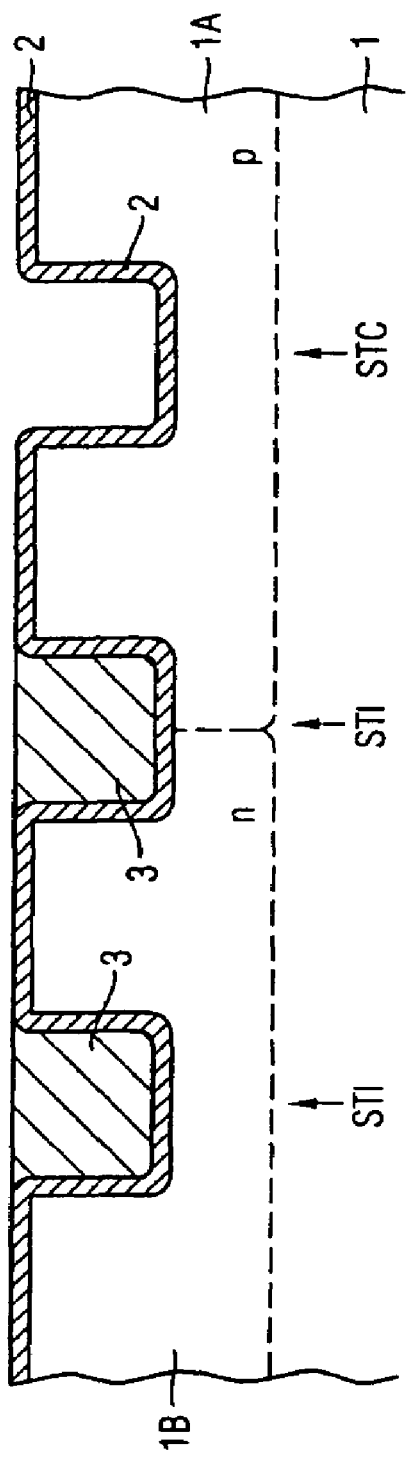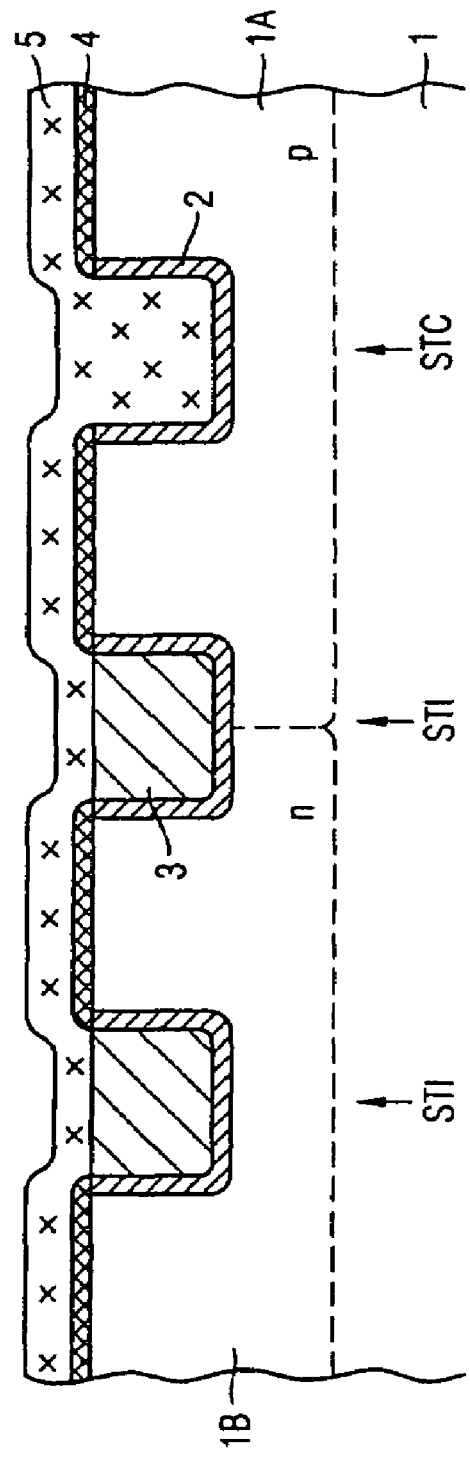
FIG 6A
FIG 6B

SEMICONDUCTOR MEMORY CELL AND ASSOCIATED FABRICATION METHOD

PRIORITY

This application claims the benefit of priority to German Patent Application DE 102004003084.7, filed Jan. 21, 2004, herein incorporated by reference in its entirety.

1. Field

The present application relates to a semiconductor memory cell and to an associated fabrication method and in particular to a semiconductor memory cell having a shallow trench capacitor.

2. Background

Future semiconductor modules will have a high demand for large and high-density memory regions. The total amount of available chip area taken up for such embedded memory regions already nowadays amounts to approximately 50% of the total chip area and will rise further. Therefore, high-density semiconductor memory cells are used to keep the memory region as small as possible and to reduce an overall size of the semiconductor module, as a result of which the fabrication costs can also be reduced. For this reason, in the semiconductor industry the trend is taking a different direction away from conventional 6-transistor semiconductor memory cells toward 1-transistor, 2-transistor and 3-transistor semiconductor memory cells (1T/2T/3T), as a result of which a higher integration density, an improved yield and a lower sensitivity towards so-called "soft errors" (soft error sensitivity) are obtained in conjunction with reduced leakage currents.

In contrast to a 6-transistor semiconductor memory cell, however, 1-transistor, 2-transistor and 3-transistor semiconductor memory cells require a capacitance or a capacitor for storing charges and also a refresh of the stored charges at predetermined time intervals. Since the refresh rate of embedded 1T/2T/3T semiconductor memory cells can be significantly higher than that of conventional DRAMS (Dynamic Random Access Memories), smaller storage capacitors can be used.

FIGS. 1 to 3 show simplified equivalent circuit diagrams for a respective 1-transistor, 2-transistor and 3-transistor semiconductor memory cell, BL denoting a bit line, WL denoting a word line and AT denoting a respective selection transistor, via which a storage capacitor C can be driven.

In accordance with FIG. 2, the two-transistor semiconductor memory cell furthermore contains inverted word lines WL and inverted bit lines BL, which drive the storage capacitor C via a further selection transistor AT.

In accordance with FIG. 3, in the 3-transistor semiconductor memory cell, the storage capacitor C is written to via a write bit line $BL_W$ and a write word line $WL_W$ and also an associated selection transistor AT and is read via a read word line WLR and a read bit line BLR and associated two further selection transistors AT.

Such 1T, 2T, 3T semiconductor memory cells are realized by using so-called embedded DRAM semiconductor memory cells, by way of example.

FIG. 4 shows a simplified sectional view of such a one-transistor semiconductor memory cell having a deep trench capacitor.

In accordance with FIG. 4, a deep trench for realization of a deep trench capacitor DTC is situated in a semiconductor substrate 10, a capacitor dielectric CD is formed at the trench surface and an electrically conductive filling layer is formed as a capacitor counter electrode CE1 at the surface of the capacitor dielectric, which, together with the semiconductor substrate 10 as a further capacitor electrode, realizes the deep trench capacitor DTC. As the selection transistor AT, use is usually made of field effect transistors having a source region S and a drain region D for definition of a channel in the semiconductor substrate 10, a gate dielectric 60 and a control electrode or a gate thereon, which essentially realizes a word line WL being formed at the surface of the channel. The source region S is connected to a bit line BL, which is situated in a metallization plane, for example, by means of a source contact KS or a corresponding contact via, for example. In a similar manner, the drain region D is connected to the deep trench capacitor DTC or the capacitor counter-electrode CE1 thereof by means of a first metallization plane M1, a drain contact KD and a capacitor contact KC, for example.

Furthermore, for definition of active regions and in particular for insulating the switching elements such as the selection transistor AT, for example, semiconductor circuits have so-called shallow trench isolations STI having, for example, a liner layer 20 and an insulation filling layer 30.

Although semiconductor memory cells with a very small space requirement can be realized with such DRAM semiconductor memory cells on account of the use of deep trench capacitors DTC, the costs are extraordinarily high in particular on account of the fabrication process for the deep trench capacitor DTC.

Therefore, at the present time, 1T, 2T and 3T semiconductor memory cells are usually realized with so-called MOS/MIM capacitors (MOS/MIM caps), the fabrication of which is significantly more cost-effective.

FIG. 5 shows a simplified sectional view of a 1-transistor semiconductor memory cell having such a MOS capacitor MOSC, identical reference symbols designating elements identical or corresponding to those in FIG. 4 and a repeated description being dispensed with below.

Accordingly, in accordance with FIG. 5, the storage capacitor is realized by a MOS capacitor MOSC, the semiconductor substrate 10 or a doping region formed therein serving as the capacitor electrode CE2 and, at its surface, there being formed a capacitor dielectric CD and thereon a capacitor counterelectrode CE1 as a polycrystalline semiconductor layer, for example. The capacitor counterelectrode CE1 is electrically connected to the drain region D of the selection transistor AT by means of a capacitor contact KC and also a drain contact KD and a preferably first metallization plane M1. However, although the costs can be significantly reduced, the area required for such a semiconductor memory cell increases greatly since the MOS or MIM capacitor is essentially formed at the surface of the semiconductor substrate and its capacitance is thus directly proportional to the area taken up from the available module area.

U.S. Pat. No. 6,121,106 A discloses a semiconductor memory cell and an associated fabrication method, in which a shallow trench capacitor is used as the trench capacitor. In this case, shallow trenches are formed in the semiconductor substrate using a standard etching method, and are completed with a capacitor dielectric and a capacitor counterelectrode to form a multiplicity of shallow trench capacitors. To realize shallow trench isolation, the capacitor counterelectrode is removed at respective shallow trench capacitors and subsequently filled with an insulation filling layer. Although in this way, by using a common fabrication method for realizing shallow trenches both for the trench isolations and for the trench capacitors, the production costs are improved in conjunction with an improved integration density, the fabrication costs are still too high for practical use.

BRIEF SUMMARY

By way of introduction only, in one embodiment a semiconductor memory cell is provided that has a storage capacitor formed in a trench of the semiconductor substrate. The storage capacitor has a capacitor counterelectrode realized by a filling layer. The filling layer has a projection that extends outside the trench as far as the source or drain region and is electrically connected thereto.

The filling layer and the capacitor counterelectrode may also form a control electrode of a selection transistor. The projection may be formed at least partly above a shallow trench isolation, the capacitor dielectric being formed as an insulation layer also in the shallow trench isolation and the shallow trenches having an identical depth. This permits identical fabrication methods to be used both for the shallow trench isolation and the storage capacitor.

In addition, a contact or contact via may be formed both on a part of the projection and on a part of the source or drain region. Such a contact-connection can be silicided, in which polycrystalline semiconductor material used as the filling layer and the surface of which is silicided or salicided using metallic layers.

With regard to the method, trenches of identical depth are fabricated for a trench isolation and the storage capacitor in the semiconductor substrate and an insulation layer is subsequently formed at the surface of the trenches. An insulation filling layer is formed at the surface of the insulation layer in the trenches of the trench isolation and a gate dielectric is realized for the selection transistor. After the removal of the insulation filling layer in the trench of the storage capacitor, an electrically conductive filling layer is formed over the whole area at the surface of the semiconductor substrate and the trench of the storage capacitor, the filling layer subsequently being patterned to realize a control electrode—lying on the gate dielectric—for the selection transistor and a capacitor counterelectrode for the storage capacitor. After the formation of the source and drain regions, the source region or the drain region of the selection transistor is connected to the capacitor counterelectrode of the storage capacitor. Both the trenches for the trench isolation and the storage capacitor as well as the counterelectrode of the storage capacitor and the control electrode of the selection transistor can be formed in a common fabrication process.

Doping wells are formed in the semiconductor substrate, which improve the electrical properties.

Furthermore, it is possible to pattern a projection from the filling layer in such a way that the projection extends from the capacitor counterelectrode as far as the source or drain region, enabling formation of a simplified contact-connection.

The foregoing summary has been provided only by way of introduction. Nothing in this section should be taken as a limitation on the following claims, which define the scope of the invention.

BRIEF DESCRIPTION OF THE DRAWINGS

FIGS. 6A to 6D show simplified sectional views for illustrating essential method steps in the fabrication of a 1T semiconductor memory cell according to the invention.

DETAILED DESCRIPTION OF THE EMBODIMENTS

Figure 1:
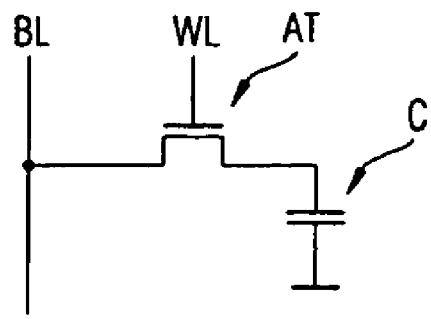
FIGS. 1 to 3 show simplified equivalent circuit diagrams of a 1T/2T/3T semiconductor memory cell in accordance with the prior art.

FIGS. 6A to 6D show simplified sectional views illustrating the fabrication of a 1-transistor semiconductor memory cell, identical reference symbols designating elements identical or corresponding to those in FIGS. 1 to 5 and a repeated description being dispensed with below.

In accordance with FIG. 6A, a semiconductor substrate 1 such as a silicon semiconductor substrate is prepared. Doping wells 1A and 1B of opposite conduction types may be formed in the semiconductor substrate 1. Doping wells of opposite conduction types effectively prevent the occurrence of leakage currents.

After the formation of the p-type well 1A and the n-type well 1B in a weakly doped or undoped semiconductor substrate 1, shallow trenches having an identical trench depth are formed for a trench isolation STI and a storage capacitor STC in the semiconductor substrate 1 or the wells 1A and 1B. The trench isolation STI is arranged in the boundary region of the doping wells 1A and 1B to improve the insulation properties.

Although these shallow trenches may be fabricated simultaneously in a common fabrication step using a common photolithographic mask, they may also be formed separately from one another. The trenches are formed by using a standardized so-called STI etching method (shallow trench isolation etch) such as is provided as standard for a multiplicity of semiconductor circuits. Such STI trenches or shallow trenches typically have a width/depth ratio of 1/3 to 1/4 and at the present time have a depth of approximately 500 nm. For masking, it is possible to use noncritical and thus cost-effective so-called RX masks as lithographic masks.

An insulation layer 2 is then formed at the surface of the trenches for the trench isolation STI. As shown in FIG. 6A, the insulation layer 2 is formed over the whole area at the surface of the semiconductor wafer 1 and thus also is also formed in all trenches of the trench isolations STI and of the storage capacitor STC. By way of example, an approximately 10 nm thick oxide layer, nitride layer and/or a layer made of a so-called high-k dielectric (i.e. dielectric having a high dielectric constant) is deposited conformally and over the whole area. In this case, this insulation layer 2 serves as a so-called "liner layer" for the trench isolation STI and as a capacitor dielectric CD in the storage capacitor STC.

Finally, an insulation filling layer 3 is formed at the surface of the insulation layer 2 within the trenches of the trench isolation STI. TEOS (Tetraethyl Orthosilicate) may be deposited as the insulation filling layer 3 over the whole area, i.e. also in the trench of the storage capacitor STC. This insulation filling layer 3 is removed using a mask (not illustrated) in the region of the storage capacitor STC and, in particular, within the trench for the storage capacitor and is otherwise caused to recede e.g. as far as the insulation layer 2 situated at the surface of the semiconductor wafer. This results in the sectional view illustrated in FIG. 6A with its trench isolations STI and the partly finished storage capacitor STC.

It is also possible, during removal of the insulation filling layer 3 within the trench for the storage capacitor STC, to remove the insulation layer 2 formed therein and later (not illustrated) form an alternative capacitor dielectric at the trench surface of the trench for the storage capacitor STC, which improves the capacitor properties, but increases the fabrication costs.

In accordance with FIG. 6B, for example after planarization in which the insulation layer 2 is removed at the surface of the semiconductor substrate 1 outside the trenches to uncover the semiconductor substrate, a gate dielectric is formed in the region of the surface of the semiconductor substrate 1 for a selection transistor AT. A thermal oxide is formed as the gate dielectric 4 over the whole area at the semiconductor substrate 1 or a semiconductor wafer, all free semiconductor areas that are not covered being converted into a high-quality gate oxide layer having a thickness of 1 to 3 nanometers.

In principle, the formation of the gate dielectric 4 may also be carried out before the removal of the insulation filling layer 3 for the storage capacitor STC, although planarization for uncovering the surface of the semiconductor substrate 1 between the trenches has already taken place beforehand.

The formation of the gate dielectric or gate oxide 4 may be preceded for example by cleaning to improve the surface quality.

Finally, in accordance with FIG. 6B, an electrically conductive filling layer 5 is formed over the whole area at the surface of the semiconductor substrate 1 and within the trench for the storage capacitor STC. The electrically conductive filling layer 5 is, for example, an in-situ doped polycrystalline semiconductor material such as polysilicon deposited with a thickness of 300 nanometers. In this way, the trench for the storage capacitor STC is completely filled with electrically conductive material, the surfaces of the semiconductor substrate 1 and also the trench isolations are covered with the electrically conductive filling layer 5.

As an alternative to the doped polysilicon, a metallic material can also be deposited as the electrically conductive filling layer 5. In addition, it is possible to carry out planarization of the filling layer 5 in the region of the storage capacitor STC.

Figure 6C:
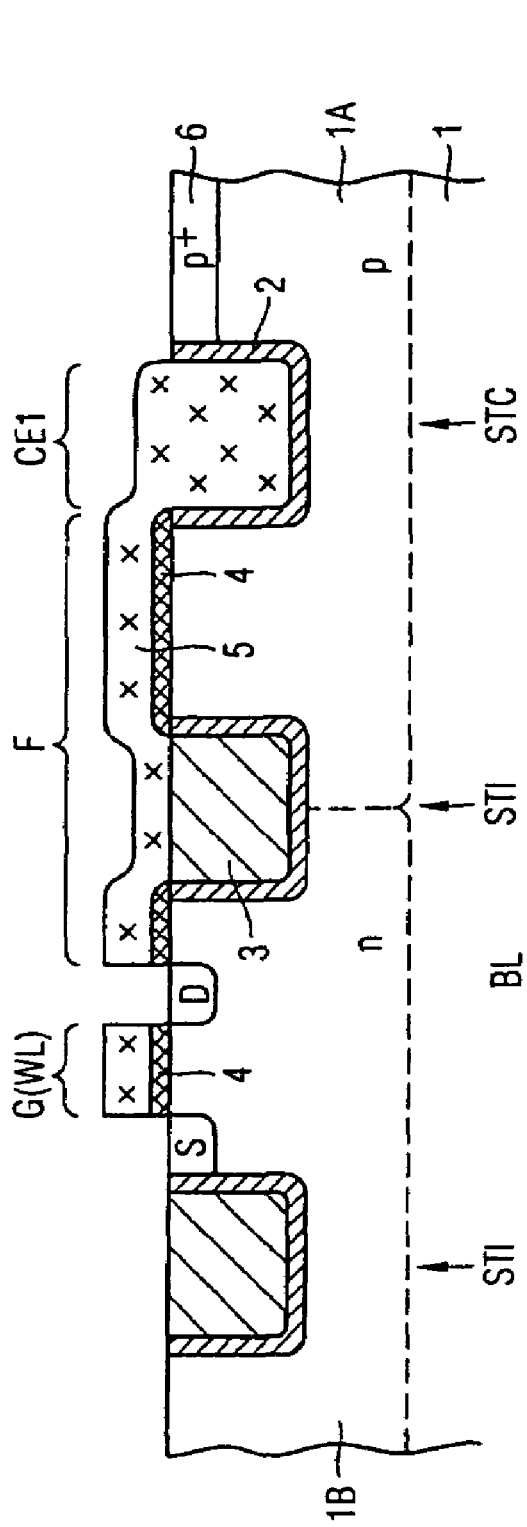

In accordance with FIG. 6C, the filling layer 5 is patterned for realization of a control electrode G—lying on the gate dielectric 4—or a corresponding word line WL for the selection transistor and a capacitor counterelectrode CE1, which has been formed within the trench for the storage capacitor STC by means of the filling layer. This patterning is effected by means of a critical mask using, for example, photolithography.

Although the storage capacitor STC can also be formed in a trench directly beside the selection transistor AT, the storage capacitor STC may be isolated from the selection transistor AT by a shallow trench isolation STI to improve the leakage current properties. The filling layer 5 may therefore have a projection F that is patterned such that it extends from the capacitor counterelectrode CE1 through to the drain region D. In particular for the case of a trench isolation STI present between the selection transistor AT and the storage capacitor STC the projection F is formed at least partially above the trench isolation STI lying in between.

After the patterning of the filling layer 5, with which the control electrode G of the selection transistor AT is simultaneously realized, and the gate dielectric 4 is completely removed laterally with respect to the control electrode to uncover the semiconductor substrate 1, source and drain regions S and D for the selection transistor AT are formed, for example, by means of ion implantation. In this case, spacers or sidewall insulation layers that are usually on the sidewalls of the gate stack are not illustrated, in the same way as possible terminal implantations, but are nevertheless present.

Figure 6D:
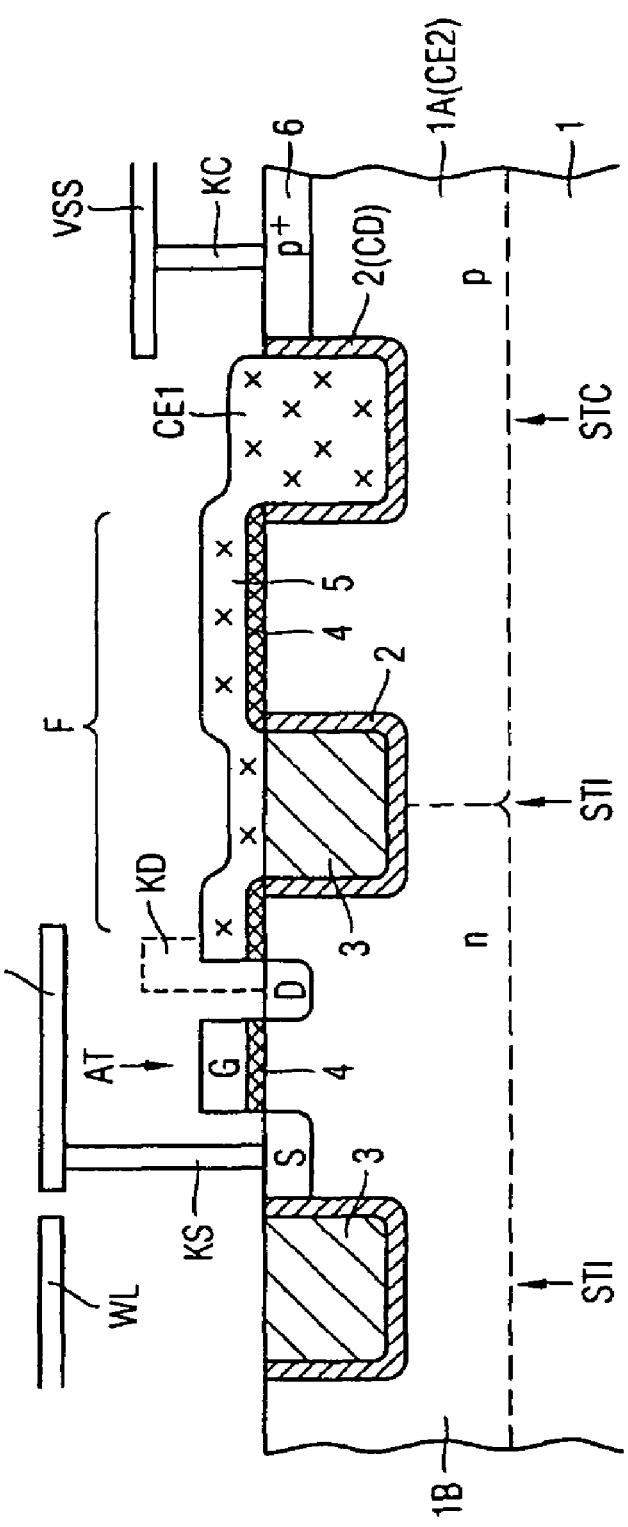

In accordance with FIG. 6D, the electrical connection of the semiconductor memory cell is effected, in particular the drain region D of the selection transistor AT is connected to the capacitor counterelectrode CE1 of the storage capacitor STC.

This electrical connection is effected by means of a drain contact KD, which is formed both on a part of the filling layer and in particular of the projection F of the filling layer 5 and on a part of the drain region D. This results in an outstanding contact-connection between the selection transistor AT and the storage capacitor STC. Moreover, the source region S of the selection transistor AT may be connected to a bit line BL in an overlying metallization layer by means of a source contact or source contact via KS. For contact-connecting the capacitor electrode CE2 or the doping well 1A, by way of example, a p+-type doping region 6 is formed in the vicinity of the storage capacitor STC, which may be formed in a self-aligned manner at the same time as the source and drain regions S and D. The doping region 6 is connected to a metallization plane VSS for realization of a ground terminal, for example, by means of a capacitor contact or capacitor contact via KC.

Figure 7:
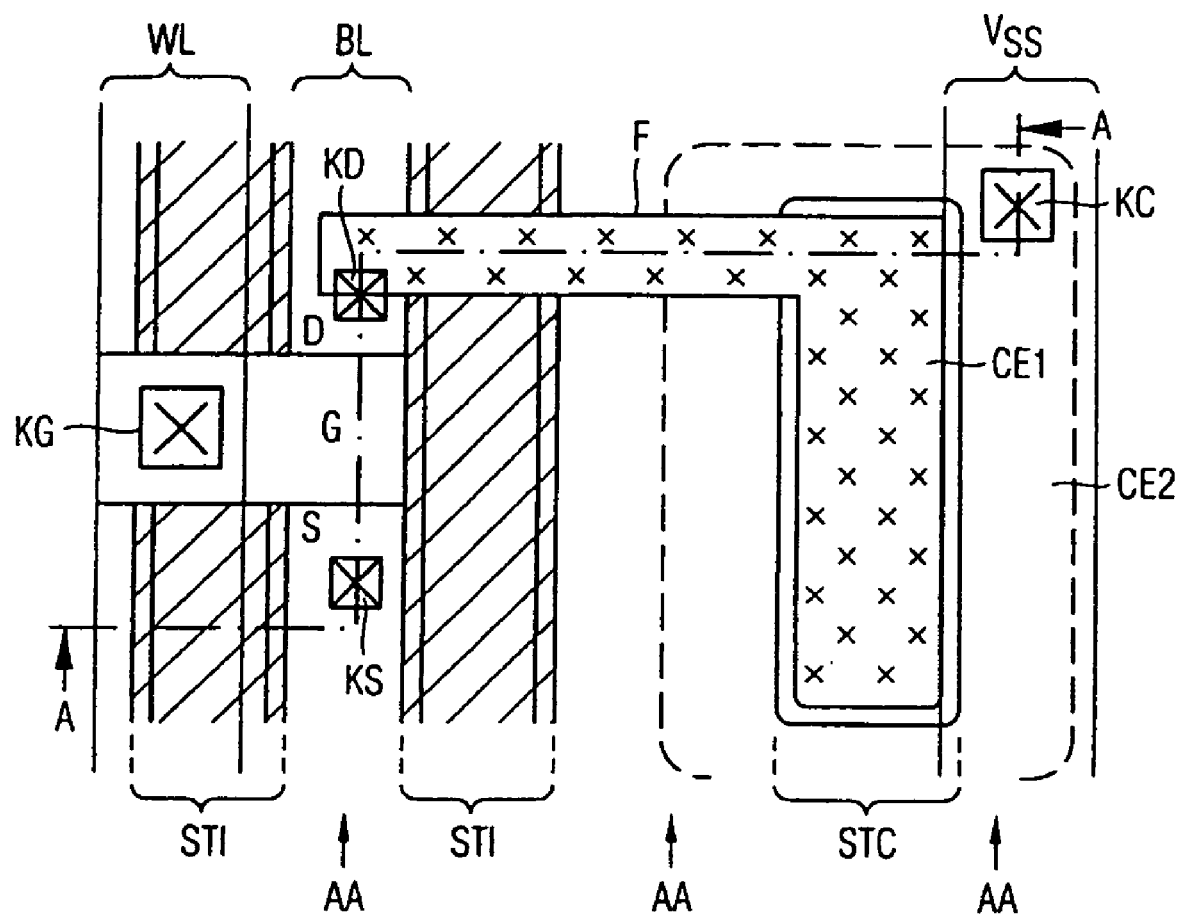
FIG. 7 shows a simplified plan view of the semiconductor memory cell according to the invention in accordance with FIG. 6D.

FIG. 7 shows a simplified plan view of the 1T semiconductor memory cell as illustrated in FIG. 6D, identical reference symbols once again designating layers or elements identical or corresponding to those in FIG. 6 and a repeated description being dispensed with below.

In accordance with FIG. 7, the trenches described above do not extend indefinitely in the semiconductor substrate or semiconductor wafer 1, but rather may constitute in particular rectangular depressions for the storage capacitors STC. The trench STC may also extend directly to the selection transistor AT, thereby improving the area utilization at the expense of the leakage properties. Furthermore, the projection F may also be omitted, and the contact KD formed both on the part of the drain region D and on a part of the capacitor counterelectrode CE1. In this case, the control electrode G may be connected to a word line WL by means of a gate contact KG.

Furthermore, in the case where a polycrystalline semiconductor layer is used, the filling layer 5 may be silicided or salicided to form a highly conductive silicide layer by deposition of a metallic layer at the silicon semiconductor surfaces. In this case, the contact KD can be omitted since a contact-connection between the storage capacitor and drain region can be realized reliably by the projection F that reaches right into the drain region. In this case, however, no insulating spacers are formed at the junction between the projection F and the drain region D.

In particular by forming the trenches and the trench insulating layer in a common method and by forming the control electrode and the capacitor counterelectrode in a further common method, it is possible to significantly reduce the fabrication costs.

Therefore, in particular for the capacitor dielectric, electrical materials are used that have a high relative permittivity and high thermal stability, and which can be formed with good conformity as well as structural and electrical homogeneity. The thinner such capacitor dielectrics are and the higher their dielectric constant is, the higher the corresponding capacitor capacitance becomes. Since the STI depth will increase as the integration density increases in future technologies, such a method will furthermore yield rising capacitances for the storage capacitors in future technologies.

Figure 2:
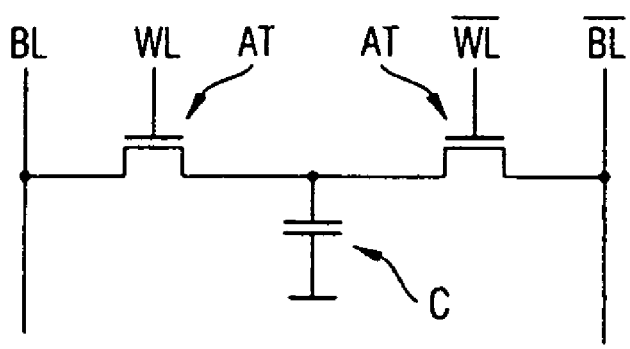
Figure 3:
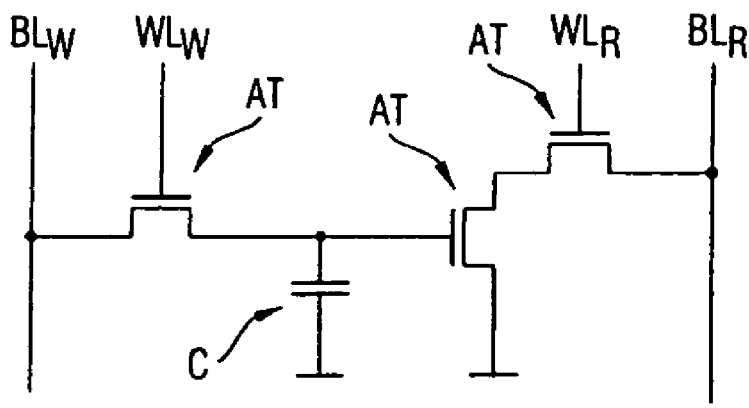
Figure 4:
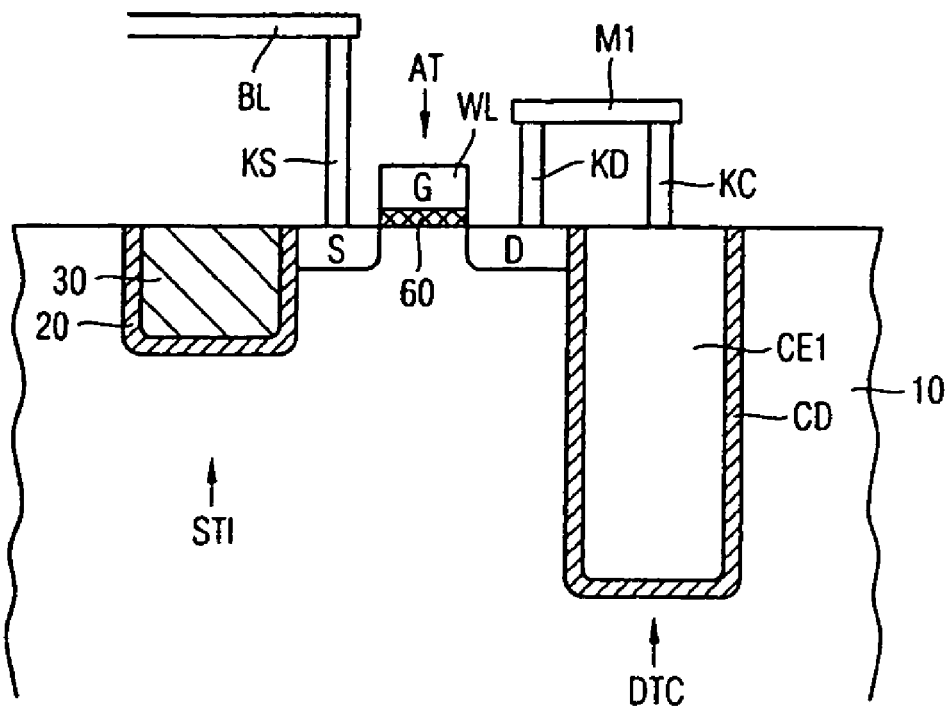
FIG. 4 shows a simplified sectional view of a 1T semiconductor memory cell having a deep trench capacitor in accordance with the prior art.
Figure 5:
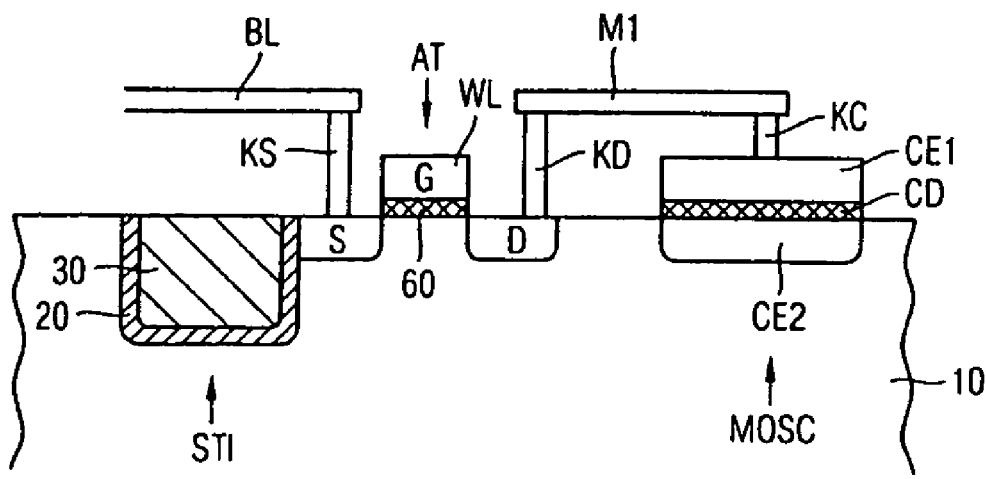
FIG. 5 shows a simplified sectional view of a 1T semiconductor memory cell having a MOS capacitor in accordance with the prior art.

Although the above describes a 1-transistor semiconductor memory cell that is formed in a silicon semiconductor substrate, the invention is not restricted thereto and in the same way encompasses the 2-transistor and 3-transistor semiconductor memory cells illustrated in FIGS. 2 and 3 and also alternative semiconductor materials. Furthermore, instead of the drain region, it is also possible for the source region of the selection transistor to be connected to the storage capacitor. In the same way, dopings of the opposite conduction type may also be used. Although the trench for the storage capacitor is essentially formed in rectangular fashion, it may in the same way have an oval form or be formed in square and also circular fashion.

It is therefore intended that the foregoing detailed description be regarded as illustrative rather than limiting, and that it be understood that it is the following claims, including all equivalents, that are intended to define the spirit and scope of this invention. Other variations may be readily substituted and combined to achieve particular design goals or accommodate particular materials or manufacturing processes.

The invention claimed is:

1. A semiconductor memory cell comprising:
   a storage capacitor for storing electrical charges; and
   a selection transistor connected to the storage capacitor and serving for selection of the semiconductor memory cell, the selection transistor having a source region and a drain region defining a channel in a semiconductor substrate, and a gate dielectric and a control electrode thereon formed at a surface of the channel; and
   a first trench, having an insulation layer and a first filling layer, between the storage capacitor and the selection transistor,
   wherein the storage capacitor is formed in a second trench of the semiconductor substrate, and a capacitor dielectric and a second filling layer are disposed at a surface of the second trench to form a capacitor counterelectrode, and
   the second filling layer has a projection that extends outside the second trench as far as the source or drain region and is electrically connected thereto.

2. The semiconductor memory cell as claimed in claim 1, wherein the projection is formed at least partly above the first trench.

3. The semiconductor memory cell as claimed in claim 2, wherein the capacitor dielectric is also formed as an insulation layer in the first trench at trench surfaces thereof, and the second trench has the same depth as that of the first trench.

4. The semiconductor memory cell as claimed in claim 1, wherein the second filling layer and the capacitor counterelectrode form an electrode for the source region or the drain region of the selection transistor.

5. The semiconductor memory cell as claimed in claim 1, wherein the second filling layer comprises polysilicon or a metal.

6. The semiconductor memory cell as claimed in claim 1, wherein a contact is formed on a part of the projection and on a part of the source or drain region and forms an electrical connection therebetween.

7. The semiconductor memory cell as claimed in claim 1, wherein a surface of the second filling layer is silicided.

8. The semiconductor memory cell as claimed in claim 1, wherein the semiconductor memory cell constitutes a 1-transistor, 2-transistor, or 3-transistor memory cell.

9. The semiconductor memory cell of claim 1 wherein the insulation layer is a thin liner layer.

10. The semiconductor memory cell of claim 1 wherein the capacitor dielectric does not extend between the first trench and the second trench.

11. The semiconductor memory cell of claim 1 further comprising a thermal oxide on the semiconductor substrate surface and between the first trench and the second trench.

* * * * *

UNITED STATES PATENT AND TRADEMARK OFFICE
CERTIFICATE OF CORRECTION

PATENT NO.         : 7,304,342 B2                                          Page 1 of 1
APPLICATION NO.    : 11/039745
DATED              : December 4, 2007
INVENTOR(S)        : Thomas Nirschl et al.

It is certified that error appears in the above-identified patent and that said Letters Patent is hereby corrected as shown below:

On the Title Page

In column 1, item (75), after "Nirschl," delete "Göttersdorf" and substitute --Loiching-- in its place.

In column 1, item (75), after "Olbrich," delete "Höhenkirchenerstr" and substitute --Hohenbrunn-- in its place.

Signed and Sealed this

Twenty Second Day of April, 2008

JON W. DUDAS
*Director of the United States Patent and Trademark Office*